(12) United States Patent
Wu et al.

(10) Patent No.: US 11,075,637 B2
(45) Date of Patent: Jul. 27, 2021

(54) SIGNAL GENERATION CIRCUIT, MEMORY STORAGE DEVICE AND SIGNAL GENERATION METHOD

(71) Applicant: PHISON ELECTRONICS CORP., Miaoli (TW)

(72) Inventors: Jen-Chu Wu, New Taipei (TW); Yu-Chiang Liao, New Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 5 days.

(21) Appl. No.: 16/702,495

(22) Filed: Dec. 3, 2019

(65) Prior Publication Data

US 2021/0143822 A1 May 13, 2021

(30) Foreign Application Priority Data

Nov. 8, 2019 (TW) ................. 108140621

(51) Int. Cl.
*H03L 7/081* (2006.01)
*G11C 16/32* (2006.01)
*G11C 16/04* (2006.01)
*H03L 7/08* (2006.01)

(52) U.S. Cl.
CPC .......... *H03L 7/081* (2013.01); *G11C 16/0483* (2013.01); *G11C 16/32* (2013.01); *H03L 7/0807* (2013.01)

(58) Field of Classification Search
None
See application file for complete search history.

(56) References Cited

U.S. PATENT DOCUMENTS

| 2008/0231331 | A1 | 9/2008 | Balraj et al. |
| 2019/0052253 | A1* | 2/2019 | Quek ..................... H03K 5/135 |
| 2020/0252258 | A1* | 8/2020 | Wu .......................... H04B 1/16 |

OTHER PUBLICATIONS

"Office Action of Taiwan Counterpart Application," dated Jan. 9, 2020, p. 1-p. 6.

\* cited by examiner

*Primary Examiner* — James G Norman
(74) *Attorney, Agent, or Firm* — JCIPRNET (57) ABSTRACT

A signal generation circuit is disclosed according to an embodiment of the invention. The signal generation circuit includes a phase control circuit, a bias control circuit and a phase interpolation circuit. The phase control circuit is configured to generate a phase control signal according to a phase adjustment signal. The bias control circuit is configured to generate a bias voltage according to the phase control signal. The phase interpolation circuit is configured to generate a clock signal according to the phase control signal and the bias voltage. The bias voltage is used to adjust a current of the phase interpolation circuit to correct an error of the clock signal.

18 Claims, 5 Drawing Sheets

SIGNAL GENERATION CIRCUIT, MEMORY STORAGE DEVICE AND SIGNAL GENERATION METHOD

CROSS-REFERENCE TO RELATED APPLICATION

This application claims the priority benefit of Taiwan application no. 108140621, filed on Nov. 8, 2019. The entirety of the above-mentioned patent application is hereby incorporated by reference herein and made a part of this specification.

BACKGROUND OF THE INVENTION

1. Field of the Invention

The invention relates to a signal processing technology, and in particular, to a signal generation circuit, a memory storage device, and a signal generation method.

2. Description of Related Art

Digital cameras, mobile phones, and MP3 players have developed very rapidly in recent years, and consumers' demands for storage media have also increased rapidly. Because a rewritable non-volatile memory module (for example, a flash memory) is characterized by non-volatile data, power saving, a small size, and no mechanical structure, the rewritable non-volatile memory module is suitable to be built in the various portable multimedia devices exemplified above.

In general, a clock data recovery circuit is usually disposed at a signal receiving end to synchronize a data signal with a clock signal. Some clock data recovery circuits implement phase adjustment of a clock signal using a phase interpolation circuit. For example, the phase interpolation circuit may synthesize a clock signal with any phase using an IQ clock. However, a clock signal output by the phase interpolation circuit is often not accurate enough in practice due to a limitation on a hardware design.

Nothing herein should be construed as an admission of knowledge in the prior art of any portion of the disclosure. Furthermore, citation or identification of any document in this application is not an admission that such document is available as prior art to the disclosure, or that any reference forms a part of the common general knowledge in the art.

SUMMARY OF THE INVENTION

The invention provides a signal generation circuit, a memory storage device, and a signal generation method, to generate a relatively accurate clock signal.

An exemplary embodiment of the invention provides a signal generation circuit including a phase control circuit, a bias control circuit, and a phase interpolation circuit. The phase control circuit is configured to generate a phase control signal according to a phase adjustment signal. The bias control circuit is coupled to the phase control circuit and configured to generate a bias voltage according to the phase control signal. The phase interpolation circuit is coupled to the phase control circuit and the bias control circuit and configured to generate a clock signal according to the phase control signal and the bias voltage. The bias voltage is used to adjust a current of the phase interpolation circuit to correct an error of the clock signal.

An exemplary embodiment of the invention further provides a memory storage device including a connection interface unit, a rewritable non-volatile memory module, a memory control circuit unit, and a clock data recovery circuit. The connection interface unit is coupled to a host system. The memory control circuit unit is coupled to the connection interface unit and the rewritable non-volatile memory module. The clock data recovery circuit is disposed in the connection interface unit, the rewritable non-volatile memory module, or the memory control circuit unit. The clock data recovery circuit includes a signal generation circuit. The signal generation circuit is configured to generate a phase control signal according to a phase adjustment signal. The signal generation circuit is further configured to generate a bias voltage according to the phase control signal. The signal generation circuit is further configured to generate a clock signal according to the phase control signal and the bias voltage. The bias voltage is used to adjust a current of a phase interpolation circuit to correct an error of the clock signal.

An exemplary embodiment of the invention further provides a signal generation method for a memory storage device. The signal generation method includes: generating a phase control signal according to a phase adjustment signal; generating a bias voltage according to the phase control signal; and generating a clock signal according to the phase control signal and the bias voltage. The bias voltage is used to adjust a current of a phase interpolation circuit to correct an error of the clock signal.

Based on the above, the phase control circuit may generate the phase control signal according to the phase adjustment signal, and the bias control circuit may generate the bias voltage according to the phase control signal. The bias voltage may be used to adjust the current of the phase interpolation circuit, thereby effectively correcting the clock signal generated by the phase interpolation circuit.

To make the features and advantages of the invention clear and easy to understand, the following gives a detailed description of embodiments with reference to accompanying drawings.

It should be understood, however, that this Summary may not contain all of the aspects and embodiments of the disclosure, is not meant to be limiting or restrictive in any manner, and that the disclosure as disclosed herein is and will be understood by those of ordinary skill in the art to encompass obvious improvements and modifications thereto.

DESCRIPTION OF THE EMBODIMENTS

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

A plurality of exemplary embodiments is provided below to describe the invention, but the invention is not limited to the exemplary embodiments. The exemplary embodiments may also be combined properly. The term "coupled" used in the entire specification (including the claims) may mean any direct or indirect connection means. For example, a first device coupled to a second device described herein should be interpreted as that the first device may be directly connected to the second device, or that the first device may be indirectly connected to the second device by other devices or by some means of connection. In addition, the term "signal" may refer to at least one current, voltage, charge, temperature, data, or any other one or more signals.

Figure 1:
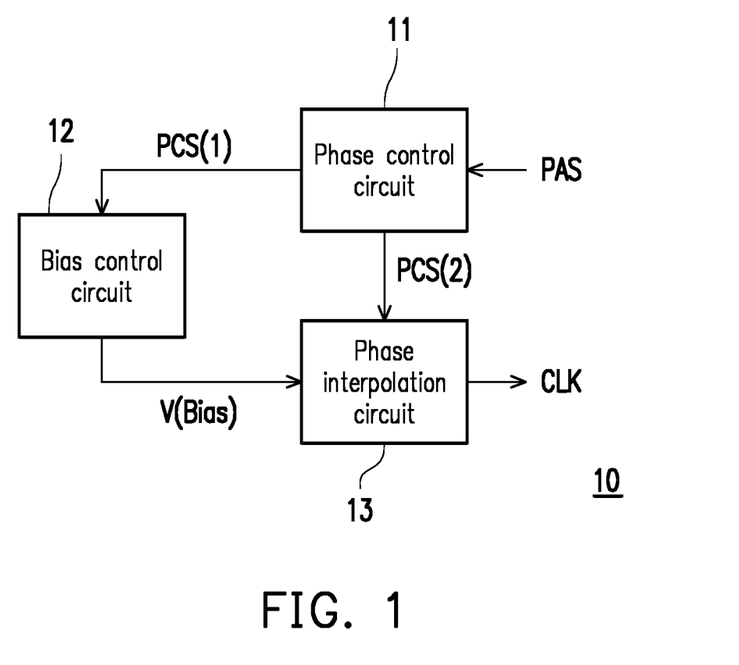
FIG. 1 is a schematic diagram of a signal generation circuit shown according to an exemplary embodiment of the invention.

FIG. 1 is a schematic diagram of a signal generation circuit shown according to an exemplary embodiment of the invention. Referring to FIG. 1, a signal generation circuit 10 may generate a signal (also referred to as a clock signal) CLK according to a signal (also referred to as a phase adjustment signal) PAS. For example, the signal PAS may carry information about a phase of the signal CLK and/or information that may be used to adjust the phase of the signal CLK. The signal generation circuit 10 may generate the signal CLK with a specific phase and/or a specific frequency according to the signal PAS through phase interpolation.

The signal generation circuit 10 includes a phase control circuit 11, a bias control circuit 12, and a phase interpolation circuit 13. The phase control circuit 11 is coupled to the bias control circuit 12 and the phase interpolation circuit 13. The phase control circuit 11 may receive the signal PAS and generate signals PCS(1) and PCS(2) according to the signal PAS. The signals PCS(1) and PCS(2) may also be collectively referred to as a phase control signal. The bias control circuit 12 may receive the signal PCS(1) and generate a bias voltage V(Bias) according to the signal PCS(1). A voltage value of the bias voltage V(Bias) is controlled by the signal PCS(1). The bias voltage V(Bias) may be used to drive the phase interpolation circuit 13. The phase interpolation circuit 13 may receive the signal PCS(2) and the bias voltage V(Bias) and perform phase interpolation according to the signal PCS(2) and the bias voltage V(Bias) to generate the signal CLK.

It should be noted that the phase of the generated signal CLK is mainly specified by the signals PCS(1) and PCS(2), and the bias voltage V(Bias) may be used to adjust a current of the phase interpolation circuit 13 according to the specified phase, thereby correcting an error of the signal CLK. For example, this error may be a phase error and/or an amplitude error. In other words, the bias control circuit 12 may perform fine tuning on the bias voltage V(Bias) according to the signal PCS(1). The phase interpolation circuit 13 may generate a more accurate signal CLK according to the driving of the adjusted bias voltage V(Bias).

Figure 2:
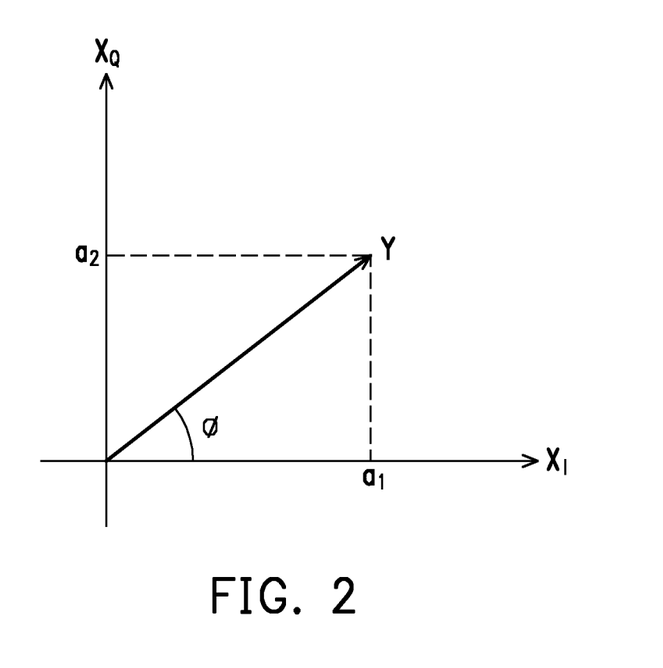
FIG. 2 is a schematic diagram of phase interpolation shown according to an exemplary embodiment of the invention.

FIG. 2 is a schematic diagram of phase interpolation shown according to an exemplary embodiment of the invention. Referring to FIG. 2, if phase interpolation is performed by using signals $X_I$ and $X_Q$ as a base for waveform synthesis to generate a signal Y with a phase Ø, the signals $X_I$, $X_Q$, and Y may be respectively represented by the following equations (1.1) to (1.3).

$$X_I = A\sin(wt) \quad (1.1)$$

$$X_Q = A\sin(wt - \pi/2) = -A\cos(wt) \quad (1.2)$$

$$Y = A\sin(wt - \emptyset) = \cos(\emptyset)XI + \sin(\emptyset)X_Q = a_1 X_I + a_2 X_Q \quad (1.3)$$

In the equations (1.1) to (1.3), A represents amplitudes of the signals $X_1$, $X_Q$, and Y. In an ideal state, parameters $a_1$ and $a_2$ need to satisfy $a_1^2 + a_2^2 = 1$ to generate the signal $Y_o$ with a perfect waveform. It should be noted that in practice, $a_1 + a_2 = 1$ is often used instead of $a_1^2 + a_2^2 = 1$ to reduce complexity and costs of a circuit design, but nonlinear distortion of phase interpolation is caused. In an exemplary embodiment in FIG. 1, the adjustment of the bias voltage V(Bias) can make an improvement on the nonlinear distortion, so that the signal CLK generated by the phase interpolation circuit 13 is closer to the desired perfect waveform.

Figure 3A:
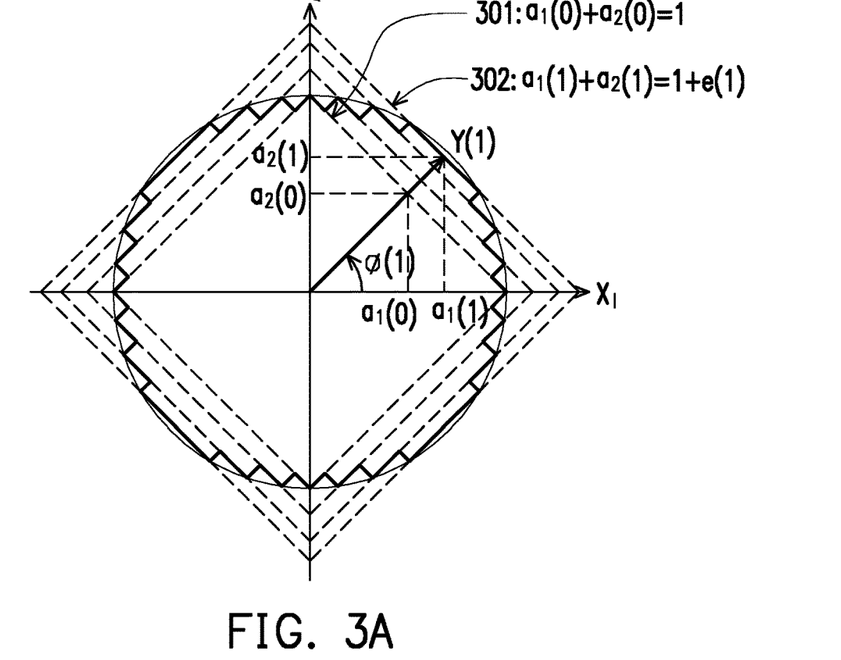
FIG. 3A and FIG. 3B are schematic diagrams for correcting nonlinear distortion of a clock signal shown according to a plurality of exemplary embodiments of the invention.
Figure 3B:
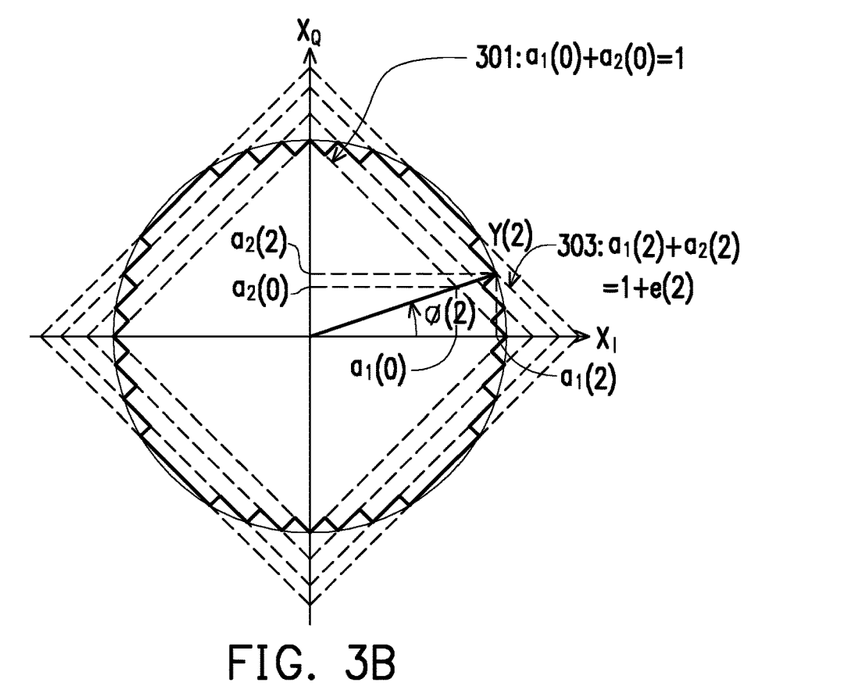

FIG. 3A and FIG. 3B are schematic diagrams for correcting nonlinear distortion of a clock signal shown according to a plurality of exemplary embodiments of the invention. Referring to FIG. 3A, a dashed line 301 is used to indicate a condition $a_1(0) + a_2(0) = 1$, and a dashed line 302 is used to indicate a condition $a_1(1) + a_2(1) = 1 + e(1)$. Under a preset operation of the phase interpolation circuit 13 in FIG. 1, the phase interpolation circuit 13 may perform waveform synthesis using the signals $X_I$ and $X_Q$ as a base to generate a signal Y(1) with a phase Ø(1). For example, the signal Y(1) may be the signal CLK in FIG. 1.

It should be noted that if the bias voltage V(Bias) in FIG. 1 is not adjusted to correct and compensate the signal Y(1), the generated signal Y(1) satisfies the condition corresponding to the dashed line 301 (that is, $a_1(0) + a_2(0) = 1$), and the signal Y(1) is confronted with the foregoing nonlinear distortion problem. However, in the exemplary embodiment in FIG. 3A, if the bias voltage V(Bias) in FIG. 1 is adjusted to correct and compensate the signal Y(1), the generated signal Y(1) may satisfy the condition corresponding to the dashed line 302 (that is, $a_1(1)+a_2(1)=1+e(1)$). For example, the parameter e(1) may be 0.5 (that is, $a_1(1)+a_2(1)=1.5$). It should be noted that the parameter e(1) is automatically generated by adjusting the bias voltage V(Bias) to compensate for the nonlinear distortion of the signal Y(1). Therefore, compared with the uncorrected signal Y(1), the corrected signal Y(1) more satisfies the condition $a_1(1)^2+a_2(1)^2=1$ in the ideal state.

Referring to FIG. 3B, the dashed line 301 is also used to indicate the condition $a_1(0)+a_2(0)=1$, and a dashed line 303 is used to indicate a condition $a_1(2)+a_2(2)=1+e(2)$. Under a preset operation of the phase interpolation circuit 13 in FIG. 1, the phase interpolation circuit 13 may perform waveform synthesis using the signals XI and XQ as a base to generate a signal Y(2) with a phase Ø(2). For example, the signal Y(2) may be the signal CLK in FIG. 1.

It should be noted that if the bias voltage V(Bias) in FIG. 1 is not adjusted to correct and compensate the signal Y(2), the generated signal Y(2) satisfies the condition corresponding to the dashed line 301 (that is, $a_1(0)+a_2(0)=1$), and the signal Y(2) is confronted with the foregoing nonlinear distortion problem. However, in the exemplary embodiment in FIG. 3B, if the bias voltage V(Bias) in FIG. 1 is adjusted to correct and compensate the signal Y(2), the generated signal Y(2) may satisfy the condition corresponding to the dashed line 303 (that is, $a_1(2)+a_2(2)=1+e(2)$). For example, the parameter e(2) may be 0.3 (that is, $a_1(2)+a_2(2)=1.3$). It should be noted that the parameter e(2) is also automatically generated by adjusting the bias voltage V(Bias) to compensate for the nonlinear distortion of the signal Y(2). In the exemplary embodiment in FIG. 3B, compared with the uncorrected signal Y(2), the corrected signal Y(2) more satisfies the condition $a_1(2)^2+a_2(2)^2=1$ in the ideal state. In addition, the bias voltage V(Bias) used to compensate the signal Y(1) in the exemplary embodiment in FIG. 3A may be different from the bias voltage V(Bias) used to compensate the signal Y(2) in the exemplary embodiment in FIG. 3B.

From another perspective, in an exemplary embodiment in FIG. 3A, the generated bias voltage V(Bias) may be used to adjust a voltage (or an amplitude) of the signal Y(1) according to an amplification ratio (also referred to as a first amplification ratio) in response to a target phase (also referred to as a first target phase) Ø(1), to correct and compensate the signal Y(1). In addition, in an exemplary embodiment in FIG. 3B, the generated bias voltage V(Bias) may be used to adjust a voltage (or an amplitude) of the signal Y(2) according to another amplification ratio (also referred to as a second amplification ratio) in response to another target phase (also referred to as a second target phase) Ø(2), to correct and compensate the signal Y(2). The first target phase is different from the second target phase. The first amplification ratio is different from the second amplification ratio.

Figure 4:
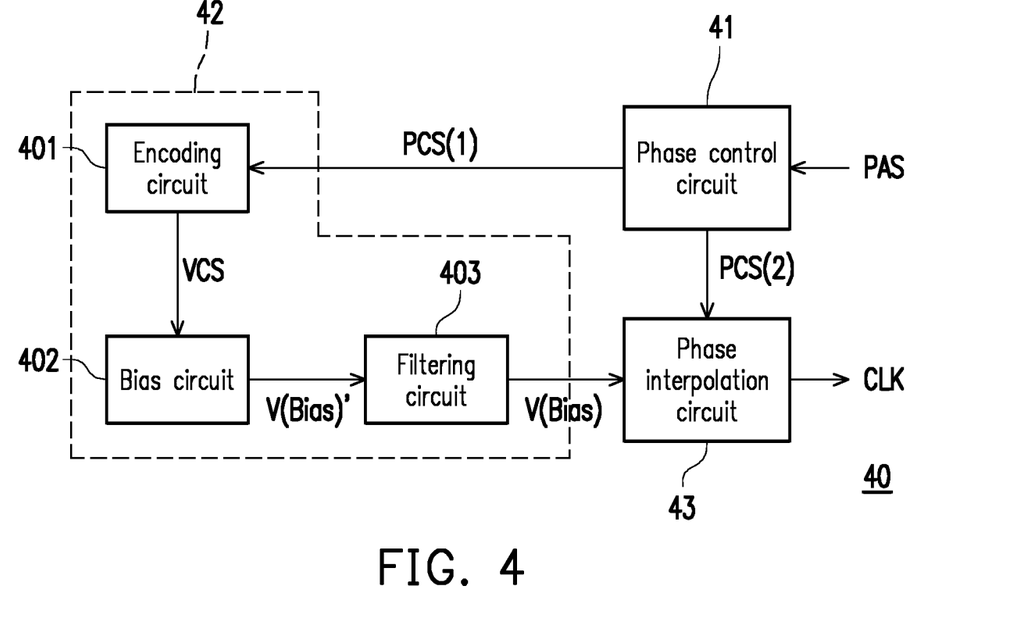
FIG. 4 is a schematic diagram of a signal generation circuit shown according to an exemplary embodiment of the invention.

FIG. 4 is a schematic diagram of a signal generation circuit shown according to an exemplary embodiment of the invention. Referring to FIG. 4, a signal generation circuit 40 includes a phase control circuit 41, a bias control circuit 42, and a phase interpolation circuit 43. The phase control circuit 41 may generate signals PCS(1) and PCS(2) according to a signal PAS. The bias control circuit 42 may generate a bias voltage V(Bias) according to the signal PCS(1). A voltage value of the bias voltage V(Bias) is controlled by the signal PCS(1). The phase interpolation circuit 43 may perform phase interpolation according to the signal PCS(2) and the bias voltage V(Bias) to generate a signal CLK.

In an exemplary embodiment, the bias control circuit 42 includes an encoding circuit 401, a bias circuit 402, and a filtering circuit 403. The bias circuit 402 is coupled to the encoding circuit 401 and the filtering circuit 403. The encoding circuit 401 may receive the signal PCS(1) and generate a signal (also referred to as a bias control signal) VCS according to the signal PCS(1). For example, the signal VCS may correspond to a digit code. The bias circuit 402 may receive the signal VCS and generate a bias voltage (also referred to as a first bias voltage) V(Bias)' according to the signal VCS. The filtering circuit 403 may receive the bias voltage V(Bias)' and filter (for example, through low-pass filtering) the bias voltage V(Bias)' to generate the bias voltage V(Bias). It should be noted that the filtering circuit 403 can make the change in the bias voltage V(Bias) more continuous and/or smooth. In another exemplary embodiment, the filtering circuit 403 may not be disposed in the signal generation circuit 40, and the phase interpolation circuit 43 may be directly driven by the bias voltage V(Bias)'. In an exemplary embodiment, the phase interpolation circuit 43 is directly driven by the bias voltage V(Bias)', so that a correction effect similar to that presented in FIG. 3A and FIG. 3B can be achieved.

Figure 5:
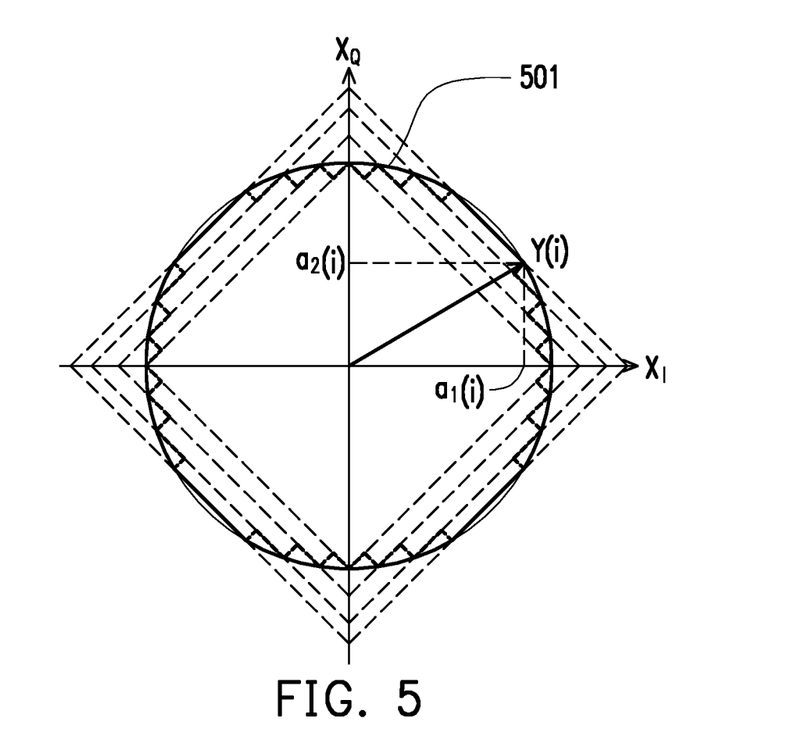
FIG. 5 is a schematic diagram of a corrected clock signal shown according to an exemplary embodiment of the invention.

FIG. 5 is a schematic diagram of a corrected clock signal shown according to an exemplary embodiment of the invention. Referring to FIG. 5, on the premise that the filtering circuit 403 in FIG. 4 is disposed, when a phase of a generated signal Y(i) is adjusted, because the change of the bias voltage V(Bias) is relatively continuous and/or smooth, the signal Y(i) can be closer to a circular boundary 501 corresponding to a condition $a_1(i)^2+a_2(i)^2=1$ in an ideal state. It should be noted that in other exemplary embodiments, the signal Y(i) may have phases of other different angles, which are not limited in the invention.

Figure 6:
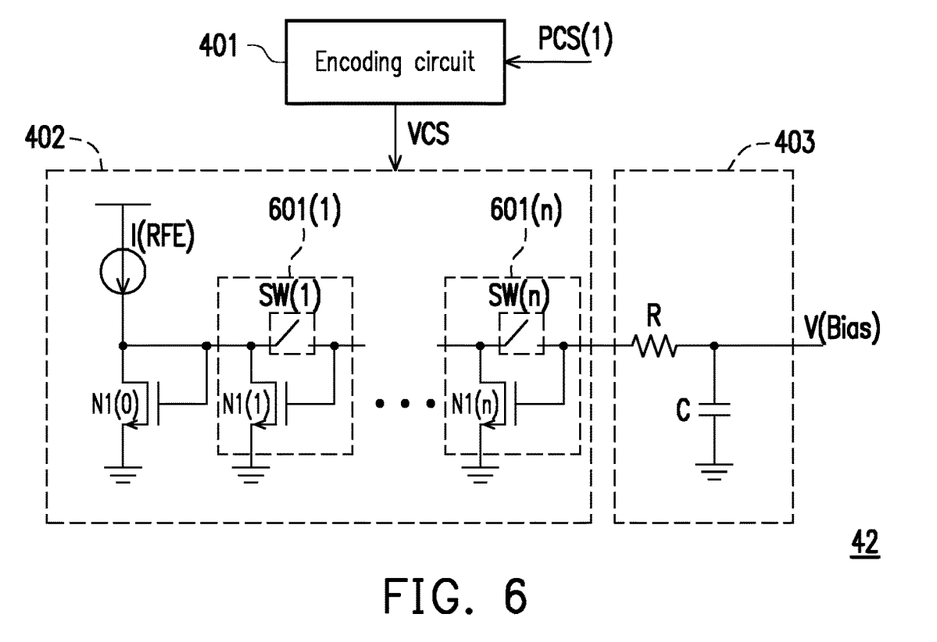
FIG. 6 is a schematic diagram of a bias control circuit shown according to an exemplary embodiment of the invention.

FIG. 6 is a schematic diagram of a bias control circuit shown according to an exemplary embodiment of the invention. Referring to FIG. 6, in an exemplary embodiment, the bias circuit 402 includes a current source I (REF) and switching circuits (also referred to as first switching circuits) 601(1) to 601(n). A switch circuit 601(i) includes a switch SW(i) and a transistor N1(i), and i may be 1 to n. The transistor N1(i) may be connected across two ends of the switch SW(i). In addition, the switch circuits 601(1) to 601(n) are serially connected. A specific coupling relationship between the switch circuits 601(1) to 601(n) may be shown in FIG. 6.

In an exemplary embodiment, the signal VCS may be used to control each of switches SW(1) to SW(n) to be turned on or turned off. Therefore, the switching circuits 601(1) to 601(n) may adjust conducting states of the switches SW(1) to SW(n) according to the signal VCS to adjust the bias voltage V(Bias)'. For example, a voltage value of the bias voltage V(Bias)' may change accordingly by increasing or decreasing a total quantity of turned-on switches in the switches SW(1) to SW(n). In addition, the filtering circuit 403 may include an RC circuit including at least one resistor R and at least one capacitor C, as shown in FIG. 6. The bias voltage V(Bias)' may be filtered by the filtering circuit 403 to generate the bias voltage V(Bias).

Figure 7:
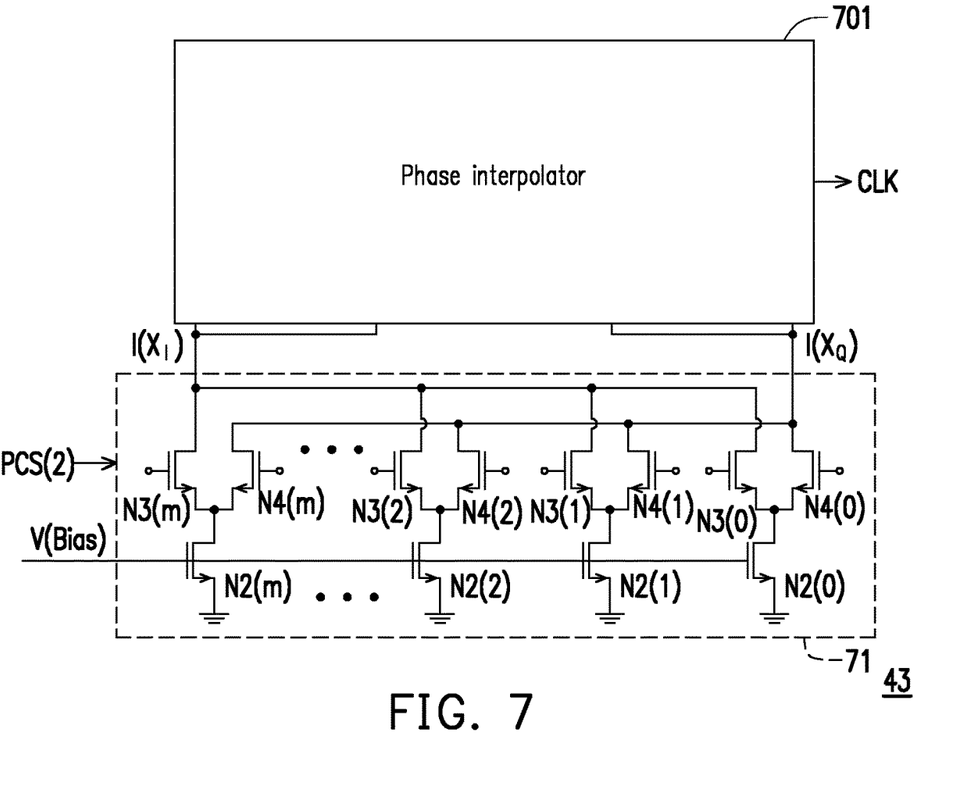
FIG. 7 is a schematic diagram of a phase interpolation circuit shown according to an exemplary embodiment of the invention.

FIG. 7 is a schematic diagram of a phase interpolation circuit shown according to an exemplary embodiment of the invention. Referring to FIG. 7, in an exemplary embodiment, the phase interpolation circuit 43 includes a drive circuit 71 and a phase interpolator 72. The drive circuit 71 is coupled to the phase interpolator 72. The drive circuit 71 is configured to receive the signal PCS(2) and the bias voltage V(Bias) and provide currents I(XI) and I(XQ) to the phase interpolator 72 according to the signal PCS(2) and the bias voltage V(Bias).

In an exemplary embodiment, the drive circuit 71 includes transistors N2(0) to N2(*m*), N3(0) to N3(*m*), and N4(0) to N4(*m*). The signal PCS(2) may include a plurality of sub-signals S(0) to S(m) and sub-signals Sb(0) to Sb(m). The sub-signals S(0) to S(m) may be respectively provided to gates of the transistors N3(0) to N3(*m*) to adjust a conducting state of each of the transistors N3(0) to N3(*m*). The sub-signals Sb(0) to Sb(m) may be respectively provided to gates of the transistors N4(0) to N4(*m*) to adjust a conducting state of each of the transistors N4(0) to N4(*m*). In addition, the bias voltage V(Bias) may be provided to the gates of the transistors N2(0) to N2(*m*) to adjust a conducting state of each of the transistors N2(0) to N2(*m*). A specific coupling relationship among the transistors N2(0) to N2(*m*), N3(0) to N3(*m*), and N4(0) to N4(*m*) may be shown in FIG. 7, and the invention is not limited thereto. Therefore, in addition to adjusting the currents I(XI) and I(XQ) respectively according to the sub-signals S(0) to S(m) and the sub-signals Sb(0) to Sb(m), the drive circuit 71 may increase or decrease current values of the currents I(XI) and I(XQ) according to the change in the bias voltage V(Bias).

The phase interpolator 72 may be configured to receive the currents I(XI) and I(XQ) and generate the signal CLK according to the currents I(XI) and I(XQ). It should be noted that in the operation of generating the signal CLK, the currents I(XI) and I(XQ) may respectively affect the parameters $a_1$ and $a_2$ in the equation (1.3). For example, the parameter $a_1$ may be positively correlated to a current value of the current I(XI), and the parameter $a_2$ may be positively correlated to a current value of the current I(XQ). Alternatively, taking FIG. 5 as an example, the currents I(XI) and I(XQ) are adjusted (for example, increased) by the bias voltage V(Bias), and the parameters $a_1(i)$ and $a_2(i)$ are automatically adjusted (for example, increased). Therefore, the signal Y(i) generated by the phase interpolator 72 can be closer to the circular boundary 501 corresponding to the condition $a_1(i)^2+a_2(i)^2=1$ in an ideal state.

Figure 8:
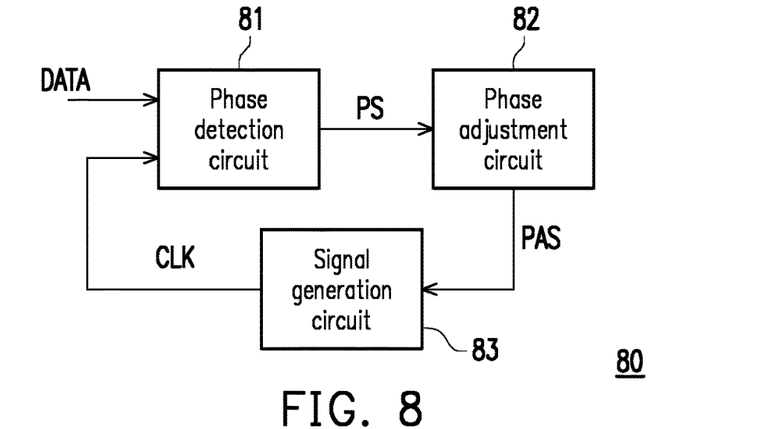
FIG. 8 is a schematic diagram of a clock data recovery circuit shown according to an exemplary embodiment of the invention.

FIG. 8 is a schematic diagram of a clock data recovery circuit shown according to an exemplary embodiment of the invention. Referring to FIG. 8, in an exemplary embodiment, a clock data recovery circuit 80 includes a phase detection circuit 81, a phase adjustment circuit 82, and a signal generation circuit 83. The signal generation circuit 83 may include the signal generation circuit 10 in FIG. 1 or the signal generation circuit 40 in FIG. 4.

The phase detection circuit 81 may be configured to receive a signal (also referred to as a first signal or a data signal) DATA and a signal (also referred to as a clock signal or a restored clock signal) CLK. The phase detection circuit 81 may detect a phase relative relationship (for example, a phase difference) between the signal DATA and the signal CLK and generate a signal (also referred to as a phase signal) PS. For example, the signal PS may reflect that a phase of the signal DATA is ahead of or behind a phase of the signal CLK at a point of time. For example, the signal PS may include a first signal and a second signal. The first signal may reflect that the phase of the signal DATA is ahead of the signal CLK. The second signal may reflect that the phase of the signal DATA is behind the phase of the signal CLK.

The phase adjustment circuit 82 is coupled to the phase detection circuit 81 and the signal generation circuit 83. The phase adjustment circuit 82 may generate a signal (also referred to as a phase control signal) PAS according to the signal PS. For example, the phase adjustment circuit 82 may generate the signal PAS according to occurrence times and/or occurrence frequency of the first signal and/or the second signal in the signal PS. For example, the signal PAS may be used to instruct the signal generation circuit 83 to generate a signal CLK with a specific phase.

In an exemplary embodiment, the clock data recovery circuit 80 may gradually synchronize the phase of the signal CLK with the phase of the signal DATA through cooperation of the phase detection circuit 81, the phase adjustment circuit 82, and the signal generation circuit 83. When the phase of the signal DATA changes, the clock data recovery circuit 80 may synchronize the phase of the signal CLK with the phase of the signal DATA again. In an exemplary embodiment, the operation of synchronizing the phase of the signal CLK with the phase of the signal DATA is also referred to as phase locking. In an exemplary embodiment, the signal generation circuit 83 in FIG. 8, the signal generation circuit 10 in FIG. 1, and/or the signal generation circuit 40 in FIG. 4 may also be referred to as a phase interpolator module or a phase interpolation circuit module.

In an exemplary embodiment, the signal generation circuit 10 in FIG. 1, the signal generation circuit 40 in FIG. 4, and/or the clock data recovery circuit 80 in FIG. 8 may be disposed in a memory storage device. In another exemplary embodiment, the signal generation circuit 10 in FIG. 1, the signal generation circuit 40 in FIG. 4, and/or the clock data recovery circuit 80 in FIG. 8 may be disposed in other types of electronic devices, and are/is not limited to the memory storage device.

Figure 9:
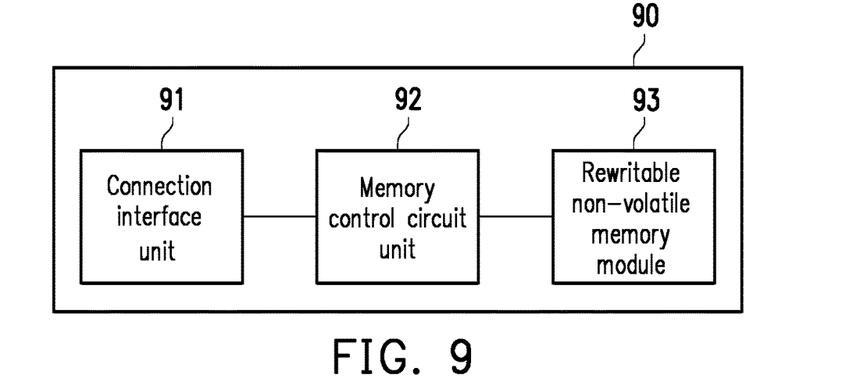
FIG. 9 is a schematic diagram of a memory storage device shown according to an exemplary embodiment of the invention.

FIG. 9 is a schematic diagram of a memory storage device shown according to an exemplary embodiment of the invention. Referring to FIG. 9, a memory storage device 90 is, for example, a memory storage device including a rewritable non-volatile memory module 93 such as a solid state drive (SSD). The memory storage device 90 may be used with a host system together, and the host system may write data to the memory storage device 90 or read data from the memory storage device 90. For example, the mentioned host system is any system that can substantially cooperate with the memory storage device 90 to store data, such as a desktop computer, a notebook computer, a digital camera, a video camera, a communications device, an audio player, a video player, or a tablet.

The memory storage device 90 includes a connection interface unit 91, a memory control circuit unit 92, and a rewritable non-volatile memory module 93. The connection interface unit 91 is configured to connect the memory storage device 90 to the host system. In an exemplary embodiment, the connection interface unit 91 is compatible with the Serial Advanced Technology Attachment (SATA) standard. However, it should be understood that the invention is not limited thereto, and the connection interface unit 91 may be compatible with the Parallel Advanced Technology Attachment (PATA) standard, the Peripheral Component Interconnect Express (PCI Express) standard, the Universal Serial Bus (USB) standard, or other appropriate standards. The connection interface unit 91 may be packaged in a wafer with the memory control circuit unit 92, or the connection interface unit 91 may be disposed outside a wafer including the memory control circuit unit 92.

The memory control circuit unit 92 is configured to perform operations such as writing, reading, and erasing data in the rewritable non-volatile memory module 93 according to an instruction of the host system. In an exemplary embodiment, the memory control circuit unit 92 is also referred to as a memory controller or a flash memory controller.

The rewritable non-volatile memory module 93 is coupled to the memory control circuit unit 92 and is configured to store data written by the host system. The rewritable non-volatile memory module 93 may be a single-level cell (SLC) NAND-type flash memory module (that is, a flash memory module that can store one bit in one cell), a multi-level cell (MLC) NAND-type flash memory module (that is, a flash memory module that can store two bits in one cell), a triple-level cell (TLC) NAND-type flash memory module (that is, a flash memory module that can store three bits in one cell), a qual-level cell (QLC) NAND-type flash memory module (that is, a flash memory module that can four three bits in one cell), other flash memory modules or other memory modules with the same characteristic.

In an exemplary embodiment, the signal generation circuit 10 in FIG. 1, the signal generation circuit 40 in FIG. 4, and/or the clock data recovery circuit 80 in FIG. 8 may be disposed in the connection interface unit 91, the memory control circuit unit 92, and/or the rewritable non-volatile memory module 93.

It should be noted that the electronic circuit structures shown in FIG. 1, FIG. 4, and FIG. 6 to FIG. 8 are merely schematic diagrams of the signal generation circuit and the clock data recovery circuit in some exemplary embodiments, and are not intended to limit the invention. In some applications that are not mentioned, more electronic elements may be added to the signal generation circuit and/or the clock data recovery circuit or replace some electronic elements to provide additional, identical, or similar functionality. In addition, in some applications that are not mentioned, the circuit layout and/or the element coupling relationship in the signal generation circuit and/or the clock data recovery circuit may be appropriately changed to meet practical requirements.

Figure 10:
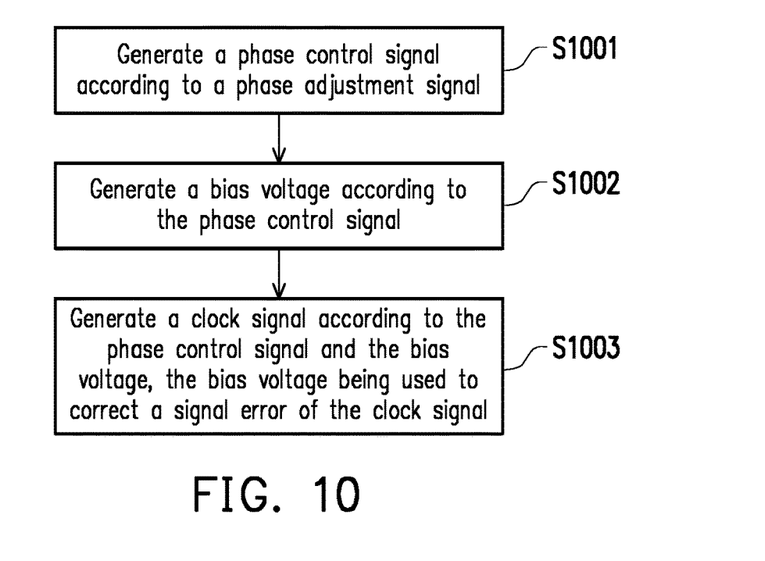
FIG. 10 is a flowchart of a signal generation method shown according to an exemplary embodiment of the invention.

FIG. 10 is a flowchart of a signal generation method shown according to an exemplary embodiment of the invention. Referring to FIG. 10, in step S1001, a phase control signal is generated according to a phase adjustment signal. In step S1002, a bias voltage is generated according to the phase control signal. In step S1003, a clock signal is generated according to the phase control signal and the bias voltage. It should be noted that the bias voltage is used to adjust a current of a phase interpolation circuit to correct an error of the clock signal.

However, the steps in FIG. 10 have been described in detail above, and the descriptions thereof are omitted herein. It should be noted that the steps in FIG. 10 may be implemented as a plurality of program codes or circuits, which are not limited in the invention. In addition, the method in FIG. 10 may be employed in combination with the foregoing exemplary embodiments, or may be employed independently, which is not limited in the invention.

Based on the foregoing, after the bias voltage is generated according to the phase control signal, the bias voltage may be used to adjust the current of the phase interpolation circuit, thereby effectively correcting the clock signal generated by the phase interpolation circuit. For example, in an exemplary embodiment, the adjusted bias voltage may be used to increase the current of the phase interpolation circuit, so that a waveform of the clock signal generated through phase interpolation is closer to a perfect waveform.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

The previously described exemplary embodiments of the disclosure have the advantages aforementioned, wherein the advantages aforementioned not required in all versions of the disclosure.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A signal generation circuit, comprising:
a phase control circuit configured to generate a phase control signal according to a phase adjustment signal;
a bias control circuit coupled to the phase control circuit and configured to generate, according to the phase control signal, a bias voltage; and
a phase interpolation circuit coupled to the phase control circuit and the bias control circuit and configured to generate a clock signal according to the phase control signal and the bias voltage,
wherein the bias voltage is used to adjust a current of the phase interpolation circuit to correct an error of the clock signal,
the bias voltage is used to adjust a voltage of the clock signal according to a first amplification ratio in response to a first target phase, the bias voltage is used to adjust the voltage of the clock signal according to a second amplification ratio in response to a second target phase, the first target phase is different from the second target phase, and the first amplification ratio is different from the second amplification ratio.

2. The signal generation circuit according to claim 1, wherein the bias control circuit comprises:
an encoding circuit coupled to the phase control circuit and configured to generate, according to the phase control signal, a bias control signal; and
a bias circuit coupled to the encoding circuit and configured to generate, according to the bias control signal, a first bias voltage.

3. The signal generation circuit according to claim 2, wherein the bias circuit comprises:
a current source; and
at least one switching circuit serially connected to the current source and configured to adjust a conducting state of the at least one switching circuit in response to the bias control signal to adjust the bias voltage.

4. The signal generation circuit according to claim 2, wherein the bias control circuit further comprises:
a filtering circuit coupled to the bias circuit and the phase interpolation circuit and configured to filter the first bias voltage to generate the bias voltage.

5. The signal generation circuit according to claim 1, wherein the phase interpolation circuit comprises:
a drive circuit; and
a phase interpolator coupled to the drive circuit,
wherein the drive circuit is configured to receive the phase control signal and the bias voltage, and provide the current to the phase interpolator according to the phase control signal and the bias voltage, and
the phase interpolator is configured to generate the clock signal according to the current.

6. The signal generation circuit according to claim 5, wherein the bias voltage affects a current value of the current.

7. A memory storage device, comprising:
a connection interface unit coupled to a host system;
a rewritable non-volatile memory module;
a memory control circuit unit coupled to the connection interface unit and the rewritable non-volatile memory module; and
a clock data recovery circuit disposed in the connection interface unit, the rewritable non-volatile memory module or the memory control circuit unit,
wherein the clock data recovery circuit comprises a signal generation circuit,
the signal generation circuit is configured to generate a phase control signal according to a phase adjustment signal,
the signal generation circuit is further configured to generate a bias voltage according to the phase control signal,
the signal generation circuit is further configured to generate a clock signal according to the phase control signal and the bias voltage, and
the bias voltage is used to adjust a current of a phase interpolation circuit to correct an error of the clock signal,
the bias voltage is used to adjust a voltage of the clock signal according to a first amplification ratio in response to a first target phase, the bias voltage is used to adjust the voltage of the clock signal according to a second amplification ratio in response to a second target phase, the first target phase is different from the second target phase, and the first amplification ratio is different from the second amplification ratio.

8. The memory storage device according to claim 7, wherein the signal generation circuit comprises:
an encoding circuit configured to generate a bias control signal according to the phase control signal; and
a bias circuit coupled to the encoding circuit and configured to generate, according to the bias control signal, a first bias voltage.

9. The memory storage device according to claim 8, wherein the bias circuit comprises:
a current source; and
at least one switching circuit serially connected to the current source and configured to adjust a conducting state of the at least one switching circuit in response to the bias control signal to adjust the bias voltage.

10. The memory storage device according to claim 8, wherein the signal generation circuit further comprises:
a filtering circuit coupled to the bias circuit and configured to filter the first bias voltage to generate the bias voltage.

11. The memory storage device according to claim 7, wherein the signal generation circuit comprises:
a drive circuit; and
a phase interpolator coupled to the drive circuit,
wherein the drive circuit is configured to receive the phase control signal and the bias voltage, and provide the current to the phase interpolator according to the phase control signal and the bias voltage, and
the phase interpolator is configured to generate the clock signal according to the current.

12. The memory storage device according to claim 11, wherein the bias voltage affects a current value of the current.

13. A signal generation method for a memory storage device, the signal generation method comprising:
generating a phase control signal according to a phase adjustment signal;
generating a bias voltage according to the phase control signal; and
generating a clock signal according to the phase control signal and the bias voltage,
wherein the bias voltage is used to adjust a current of a phase interpolation circuit to correct an error of the clock signal,
wherein a step of generating the clock signal according to the phase control signal and the bias voltage comprises:
adjusting a voltage of the clock signal according to the bias voltage and a first amplification ratio in response to a first target phase; and
adjusting the voltage of the clock signal according to the bias voltage and a second amplification ratio in response to a second target phase, wherein the first target phase is different from the second target phase, and the first amplification ratio is different from the second amplification ratio.

14. The signal generation method according to claim 13, wherein the step of generating the bias voltage according to the phase control signal comprises:
generating a bias control signal according to the phase control signal; and
generating a first bias voltage according to the bias control signal.

15. The signal generation method according to claim 14, wherein the step of generating the first bias voltage according to the bias control signal comprises:
adjusting a conducting state of at least one switching circuit in response to the bias control signal to adjust the bias voltage.

16. The signal generation method according to claim 14, wherein the step of generating the bias voltage according to the phase control signal further comprises:
filtering the first bias voltage to generate the bias voltage.

17. The signal generation method according to claim 13, wherein the step of generating the clock signal according to the phase control signal and the bias voltage comprises:
providing the current to a phase interpolator according to the phase control signal and the bias voltage; and
generating, by the phase interpolator, the clock signal according to the current.

18. The signal generation method according to claim 17, wherein the bias voltage affects a current value of the current.

* * * * *